United States Patent [19]

Gantioler et al.

[11] Patent Number: 5,726,478
[45] Date of Patent: Mar. 10, 1998

[54] INTEGRATED POWER SEMICONDUCTOR COMPONENT HAVING A SUBSTRATE WITH A PROTECTIVE STRUCTURE IN THE SUBSTRATE

[75] Inventors: Josef-Matthias Gantioler; Ludwig Leipold; Rainald Sander, all of München; Jens-Peer Stengl, Grafrath; Jenoe Tihanyi, Kirchheim, all of Germany

[73] Assignee: Siemens Aktiengesellschaft, Munich, Germany

[21] Appl. No.: 769,348

[22] Filed: Dec. 19, 1996

Related U.S. Application Data

[63] Continuation of Ser. No. 499,058, Jul. 6, 1995, abandoned.

[30] Foreign Application Priority Data

Jul. 6, 1994 [DE] Germany ............. 44 23 733.2

[51] Int. Cl.[6] ............................................. H01L 23/62
[52] U.S. Cl. ..................... 257/355; 257/372; 257/373; 257/369; 257/360; 257/379; 257/500
[58] Field of Search ........................ 257/372, 547, 257/500, 504, 544, 553, 127, 409, 373, 376, 369, 355–363

[56] References Cited

U.S. PATENT DOCUMENTS 3,967,295 6/1976 Stewart ....................... 257/358
4,616,243 10/1986 Minato et al. ................ 257/357
5,491,358 2/1996 Miyata ........................ 257/372

FOREIGN PATENT DOCUMENTS 0236967 9/1987 European Pat. Off. .
0283158 12/1986 Japan ........................... 257/372

OTHER PUBLICATIONS

Design und Elektronik, Issue 21, Oct. 14, 1986, pp. 126–130 (Enzinger et al.).
Phillips Journal of Research, vol. 44, Nos. 2/3, 1989, pp. 241–255 (Grossens et al.).

Primary Examiner—Sara W. Crane
Assistant Examiner—David B. Hardy
Attorney, Agent, or Firm—Herbert L. Lerner; Laurence A. Greenberg

[57] ABSTRACT

An integrated power semiconductor component includes a substrate of a first conduction type. At least one first region of a second conduction type is embedded in the substrate and at least one second region of the second conduction type is embedded in the substrate. A substrate contact supplies a supply voltage. Contact-making semiconductor components are embedded in the first region and in the second region. At least a portion of the semiconductor components in the first region control at least a portion of the semiconductor components in the second region. A third region of the second conduction type is disposed between the first region and the second region, and the first region and the third region are at different potentials.

5 Claims, 1 Drawing Sheet

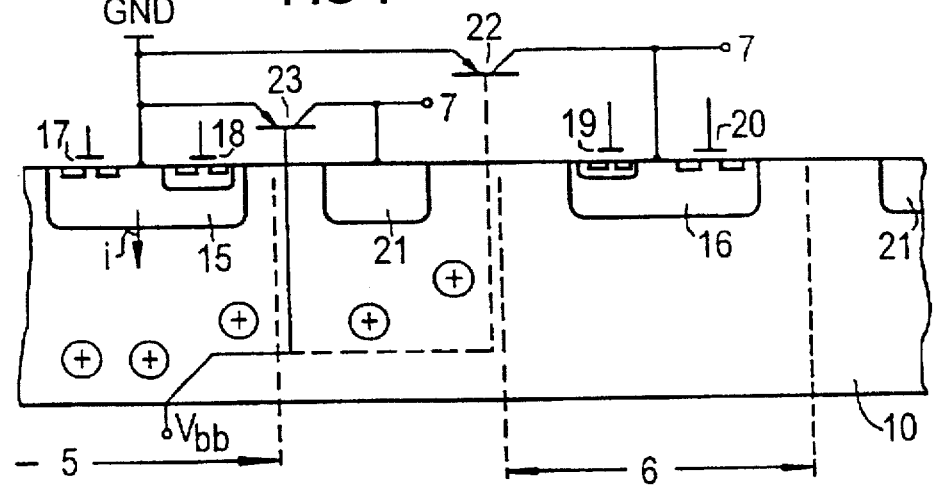
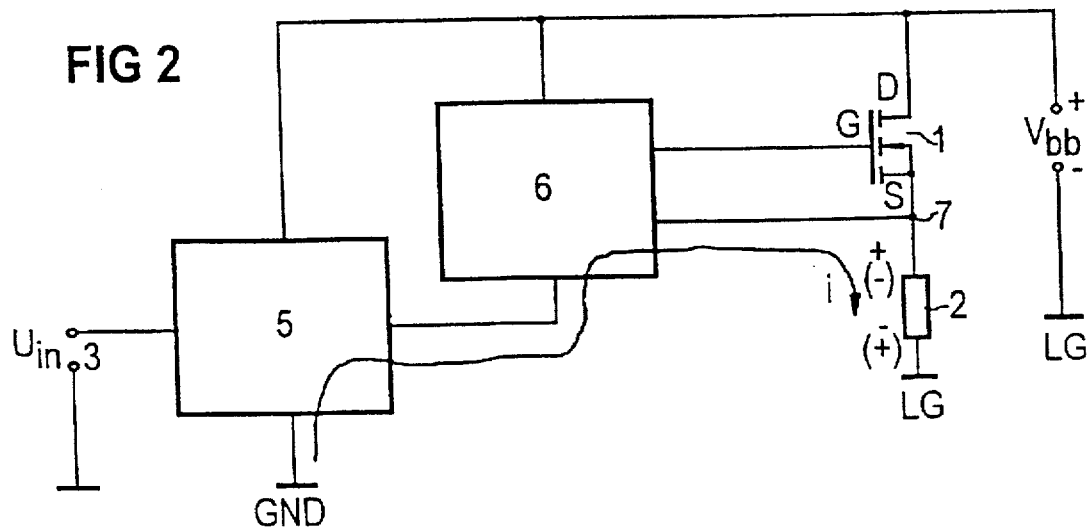

INTEGRATED POWER SEMICONDUCTOR COMPONENT HAVING A SUBSTRATE WITH A PROTECTIVE STRUCTURE IN THE SUBSTRATE

This application is a continuation, of application Ser. No. 08/499,058, filed on Jul. 6, 1995, now abandoned.

BACKGROUND OF THE INVENTION

Field of the Invention

The invention relates to an integrated power semiconductor component having a substrate of a first conduction type, at least one first region of a second conduction type being embedded in the substrate and at least a second region of the second conduction type being embedded in the substrate. A substrate contact supplies a supply voltage. Contact-making semiconductor components are embedded in the first region and in the second region. At least a portion of the semiconductor components in the first region control at least a portion of the semiconductor components in the second region.

Such an integrated semiconductor component has, for example, been described in the journal entitled "Design und Elektronik" [Design and Electronics], Issue 21, Oct. 14, 1986, pages 126 to 130. In FIG. 3 of that publication a principle circuit diagram of an integrated power semiconductor component is specified. The cited reference furthermore describes the fact that all of the circuit elements can be integrated in a single substrate. In this case the components are generally disposed in p-doped regions (wells) if the substrate is n-conducting.

In the prior art integrated power semiconductor components, such as that illustrated in FIG. 2 and described below, a parasitic structure may form between two functional units and prevent reliable driving of a power MOSFET.

SUMMARY OF THE INVENTION

It is accordingly an object of the invention to provide an integrated power semiconductor component with a protection structure, which overcomes the hereinafore-mentioned disadvantages of the heretofore-known devices of this general type and which prevents the formation of a parasitic structure between two functional units, so that reliable driving of the power MOSFET is guaranteed.

With the foregoing and other objects in view there is provided, in accordance with the invention, an integrated power semiconductor component, comprising a substrate of a first conduction type; at least one first region of a second conduction type being embedded in the substrate; at least one second region of the second conduction type being embedded in the substrate; a substrate contact for supplying a supply voltage; contact-making semiconductor components embedded in the first region and in the second region, at least a portion of the semiconductor components in the first region controlling at least a portion of the semiconductor components in the second region; and a third region of the second conduction type being disposed between the first region and the second region, the first region and the third region being at different potentials.

In accordance with another feature of the invention, the third region is at the same potential as the second region.

In accordance with a further feature of the invention, the substrate is n-doped, the regions are p-doped and the third region is at a more negative potential than the first region.

In accordance with a concomitant feature of the invention, the third region completely surrounds either the first region or the second region.

Other features which are considered as characteristic for the invention are set forth in the appended claims.

Although the invention is illustrated and described herein as embodied in an integrated power semiconductor component with a protection structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and fragmentary, diagrammatic, cross-sectional view of an integrated power semiconductor component according to the invention; and FIG. 2 is a simplified block and schematic circuit diagram of an integrated power semiconductor component according to the prior art, which is used to explain the problem on which the invention is based.

DESCRIPTION OF PREFERRED EMBODIMENT

Referring now to the figures of the drawing in detail and first, particularly, to FIG. 2 thereof, there is seen a so-called "high-side" switch. The switch is distinguished by the fact that a power MOSFET 1 is connected on the drain side to one terminal of a supply voltage $V_{bb}$ from an operating voltage source. A load 2 has one terminal being connected in series with the MOSFET 1 on the source side. Another terminal of the load 2 which is not connected to the MOSFET 1 is connected to load ground or earth LG. Another terminal of the supply voltage $V_{bb}$ from the operating voltage source is likewise connected to the load ground LG. The MOSFET 1 is controlled by a functional unit 6 which contains all of the elements for controlling the high-side switch. Those elements include, for example, a charge pump, through the use of which a gate voltage of the MOSFET can be set to a value which is higher than the supply voltage $V_{bb}$. They also include a transistor which is connected between a gate terminal and a source terminal of the MOSFET 1 and through the use of which the MOSFET 1 can be switched off. The functional unit 6 furthermore contains at least one transistor in a gate supply line, through the use of which a charging current for a gate-source capacitor can be controlled. The structure of the functional unit is known per se and therefore does not constitute the subject matter of the invention.

For its part, the functional unit 6 is controlled by a drive IC 5. The latter essentially contains logic circuits. Both the functional unit 6 and the drive IC 5 are supplied by the supply voltage $V_{bb}$.

In order to switch on the high-side switch, an input voltage $U_{in}$ is applied to input terminals 3 of the drive IC 5 and the MOSFET 1 is turned on. The switching-on of a high-side switch, for example through the use of a charge pump, is known (such as, for example, from Published European Application 0 239 861) and therefore is not explained in detail. As a result a current flows from the drain terminal of the MOSFET 1 through the load 2 to the load ground LG. In this case a potential at a connection point 7 between the source terminal S and the load 2 is positive as compared to a potential at the load ground LG.

When the high-side switch is switched off, the current through the MOSFET 1 is interrupted and the voltage across the inductive load 2 is reversed. The potential at the point 7 (the source terminal of the MOSFET 1) is therefore negative as compared to the load ground LG. Since in all application cases there is an electrical connection between the load ground LG and the relevant earth or ground terminal GND, only the terminal GND is positively biased.

If the semiconductor components contained in the functional units 5 and 6 are produced by using the self-isolating technique (such as in FIG. 1 of the cited literature), then malfunctions can result because of the potential rise at the terminal GND, which prevent reliable switching of the power MOSFET 1. That malfunction is explained with the aid of FIG. 1 which also contains the invention.

In FIG. 1 a substrate in which the functional units 5 and 6 are integrated is indicated by reference numeral 10. In the present case it is n-doped. The functional unit 5 is formed by semiconductor components, some of which are symbolically represented and are indicated by reference numerals 17, 18. They are disposed in a p-doped first region 15. Components of the functional unit 6 are likewise symbolically represented and are indicated by reference numerals 19 and 20. They are disposed in a p-doped second region 16. The region 15 of the functional unit 5 is provided with a contact which is connected to the terminal GND. The region 16 of the functional unit 6 has a contact which is connected to the point 7 and which is therefore connected to the source potential of the MOSFET 1. The MOSFET 1 is not represented in the configuration according to FIG. 1 for the sake of better clarity. The manner in which the components 17, 18 control the components 19, 20 is also not represented, since this is not important for explaining the invention.

If, when switching off the inductive load 2, the terminal GND is positive with respect to the supply voltage $V_{bb}$, then the pn junction between the region 15 and the substrate 10 is forward-biased and a current i flows which floods the substrate with positive charge carriers. These charge carriers flow towards the lowest potential, that is to say to the region 16, the terminal of which is negative with respect to the potential GND and with respect to the potential $V_{bb}$, because of the voltage reversal when switching off. A parasitic pnp bipolar transistor 22 is thus formed, as is illustrated by broken lines. In this case a base terminal of the bipolar transistor 22 is at the substrate potential $V_{bb}$. Since the latter is negative with respect to the potential at the terminal GND, the parasitic bipolar transistor 22 is switched on and the potential of the region or well 16 is pulled towards the potential at the terminal GND. Correct operation of the functional unit 6 is therefore no longer guaranteed, so that reliable control of the MOSFET 1 is impossible.

In FIG. 1, a third region is indicated by reference numeral 21. Like the first region 15 and the second region 16, the third region 21 is p-doped and preferably has the same depth as those regions. The third region 21 has a contact which is connected to a different potential from the potential of the first region 15. In the case of the specified conductivity types, this potential is lower than the potential at the terminal GND. The contact is expediently at the lowest potential which occurs when switching off, and is thus connected to the point 7.

If the MOSFET 1 is switched over from its on state to its off state, then a parasitic transistor is formed between the first region 15 and the third region 21. The parasitic transistor is indicated by reference numeral 23. An alteration of the potential of the region 21, which accompanies switching-on of the parasitic transistor 23, has no bearing on the operation of the integrated semiconductor configuration, since the potential of the region 16 is not altered. The functional unit 6 therefore remains fully operational.

It may be sufficient for the third region 21 to have the same length as the regions 15 and 16 or to be somewhat longer. Formation of the parasitic bipolar transistor 22 is reliably prevented when the third region 21 surrounds the second region 16 in a ring, as is represented in FIG. 1. It may, however, also be expedient for the third region 21 to surround the first region 15 in a ring.

In FIG. 1 it has been assumed, for the sake of simplicity, that the functional units 5 and 6 in each case are formed of only a single respective region 15 and 16. Of course, in complex structures these functional units contain a plurality of such regions, with a multiplicity of semiconductor components integrated therein.

Therefore, the circuit of the invention prevents the formation of a parasitic structure between the functional unit 5 and the functional unit 6, so that reliable driving of the power MOSFET 1 is guaranteed.

We claim:

1. An integrated power semiconductor circuit comprising:
   a substrate of a first conduction type; at least one first region of a second conduction type embedded in said substrate; and drive means for driving said power semiconductor component arranged in said first region;
   at least one second region of the second conduction type embedded in said substrate; and control means for controlling said power semiconductor arranged in said second region;
   contact-making components embedded in said first and second region including a substrate contact for supplying a supply voltage;
   a power MOSFET having a drain, a source, and an inductive load connected to said source, and
   a third region of the second conduction type disposed between said first and second region embedded in said substrate, said first and second regions being at different potentials, and wherein upon turnoff of said power MOSFET said third region attracts minority charge carriers in said substrate to maintain operability of said functional unit.

2. The integrated power semiconductor component according to claim 1, wherein said third region and said second region are at the same potential.

3. The integrated power semiconductor component according to claim 2, wherein said substrate is n-doped, said regions are p-doped, and a more negative potential than said first region is connected to said third region.

4. The integrated power semiconductor component according to claim 1, wherein said third region completely surrounds said second region.

5. The integrated power semiconductor component according to claim 1, wherein said third region completely surrounds said first region.

* * * * *

UNITED STATES PATENT AND TRADEMARK OFFICE
CERTIFICATE OF CORRECTION

PATENT NO : 5,726,478
DATED    : March 10, 1998
INVENTOR(S): Josef-Mathias Gantioler It is certified that error appears in the above-identified patent and that said Letters Patent is hereby corrected as shown below:

On the title page:

Item [22] should read as follows:

Filed:    Dec. 18, 1996

Signed and Sealed this

Twenty-third Day of March, 1999

Attest:

Q. TODD DICKINSON

*Attesting Officer*          *Acting Commissioner of Patents and Trademarks*